(12) United States Patent
Lim et al.

(10) Patent No.: US 10,409,126 B2
(45) Date of Patent: Sep. 10, 2019

(54) THIN FILM TRANSISTOR UNAFFECTED BY LIGHT AND DISPLAY APPARATUS HAVING THE SAME

(71) Applicants: SAMSUNG DISPLAY CO., LTD., Yongin, Gyeonggi-Do (KR); KOOKMIN UNIVERSITY INDUSTRY ACADEMY COOPERATION FOUNDATION, Seongbuk-Gu, Seoul (KR)

(72) Inventors: Jihun Lim, Goyang-si (KR); Byung Du Ahn, Hwaseong-si (KR); Gun Hee Kim, Hwaseong-si (KR); Junhyun Park, Suwon-si (KR); Jehun Lee, Seoul (KR); Jaewoo Park, Seongnam-si (KR); Dae Hwan Kim, Seoul (KR); Hyunkwang Jung, Seoul (KR); Jaehyeong Kim, Seoul (KR)

(73) Assignees: SAMSUNG DISPLAY CO., LTD., Yongin, Gyeonggi-Do (KR); KOOKMIN UNIVERSITY INDUSTRY ACADEMY COOPERATION FOUNDATION, Seoul (KR)

( * ) Notice: Subject to any disclaimer, the term of this patent is extended or adjusted under 35 U.S.C. 154(b) by 127 days.

(21) Appl. No.: 13/782,823

(22) Filed: Mar. 1, 2013

(65) Prior Publication Data

US 2013/0271687 A1 Oct. 17, 2013

(30) Foreign Application Priority Data

Apr. 16, 2012 (KR) .................. 10-2012-0039237

(51) Int. Cl.
*H01L 51/10* (2006.01)
*G02F 1/1362* (2006.01)
(Continued)

(52) U.S. Cl.
CPC ...... *G02F 1/1368* (2013.01); *H01L 29/41725* (2013.01); *H01L 29/41733* (2013.01);
(Continued)

(58) Field of Classification Search
CPC combination set(s) only.
See application file for complete search history.

(56) References Cited

U.S. PATENT DOCUMENTS 5,017,984 A * 5/1991 Tanaka .................. G02F 1/1368
257/59
5,057,885 A * 10/1991 Matsumoto ........ G11C 16/0466
257/326
(Continued)

FOREIGN PATENT DOCUMENTS

CN 1808253 7/2006
CN 101149546 3/2008
(Continued)

OTHER PUBLICATIONS

English Abstract for Publication No. 2009-239264.
(Continued)

*Primary Examiner* — Lauren Nguyen
(74) *Attorney, Agent, or Firm* — F. Chau & Associates, LLC

(57) ABSTRACT

A thin film transistor includes a gate electrode, a first insulating layer disposed to cover the gate electrode, a semiconductor layer disposed on the first insulating layer that includes a first side surface portion, a source electrode disposed on the semiconductor layer, and a drain electrode disposed on the first insulating layer that includes a second side surface portion. The first side surface portion makes contact with the second side surface portion.

16 Claims, 20 Drawing Sheets

(51) Int. Cl.
  *G02F 1/1368* (2006.01)
  *H01L 29/417* (2006.01)
  *H01L 29/786* (2006.01)

(52) U.S. Cl.
  CPC .... *H01L 29/41783* (2013.01); *H01L 29/7869* (2013.01); *H01L 51/105* (2013.01); *G02F 1/1362* (2013.01); *G02F 1/136286* (2013.01)

(56) References Cited

U.S. PATENT DOCUMENTS

| | | | |
|---|---|---|---|
| 5,396,885 A * | 3/1995 | Nelson | A62B 25/00 128/204.18 |
| 6,608,658 B1 | 8/2003 | Tsujimura et al. | |
| 6,888,161 B2 | 5/2005 | Shih | |
| 6,921,951 B2 | 7/2005 | Lai | |
| 6,933,529 B2 | 8/2005 | Yoo et al. | |
| 7,897,971 B2 | 3/2011 | Kurokawa et al. | |
| 7,948,784 B2 | 5/2011 | Kajigaya | |
| 8,269,217 B2 | 9/2012 | Arai et al. | |
| 2003/0117538 A1* | 6/2003 | Lim | G02F 1/1368 349/43 |
| 2004/0142502 A1* | 7/2004 | Yoo et al. | 438/24 |
| 2005/0052583 A1* | 3/2005 | Kim | 349/43 |
| 2006/0061702 A1* | 3/2006 | Seo | G02F 1/1368 349/43 |
| 2006/0158596 A1 | 7/2006 | Yoshinaga | |
| 2007/0030423 A1* | 2/2007 | Ono et al. | 349/106 |
| 2008/0135842 A1 | 6/2008 | Lin et al. | |
| 2008/0135843 A1 | 6/2008 | Lin et al. | |
| 2008/0258140 A1* | 10/2008 | Lee | H01L 21/02554 257/43 |
| 2009/0001375 A1 | 1/2009 | Yamazaki et al. | |
| 2009/0061573 A1 | 3/2009 | Miyairi et al. | |
| 2009/0250693 A1* | 10/2009 | Jeong et al. | 257/43 |
| 2010/0117077 A1 | 5/2010 | Yamazaki et al. | |
| 2011/0169006 A1 | 7/2011 | Park et al. | |

FOREIGN PATENT DOCUMENTS

| | | | |
|---|---|---|---|
| CN | 101800248 | 8/2010 | |
| JP | 2001-308333 | 11/2001 | |
| JP | 2007-035964 | 2/2007 | |
| JP | 2009-239264 | 10/2009 | |
| KR | 1020030086736 | 11/2003 | |
| KR | 10-2005-0046164 | 5/2005 | |
| KR | 10-2008-0054629 | 6/2008 | |
| KR | 10-2008-0054783 | 6/2008 | |
| KR | 10-2011-0058076 | 6/2011 | |
| KR | 10-2011-0066640 | * 6/2011 | G02F 1/136 |
| KR | 1020110066640 | 6/2011 | |
| KR | 1020110082839 | 7/2011 | |

OTHER PUBLICATIONS

English Abstract for Publication No. 2001-308333.
English Abstract for Publication No. 2007-035964.
English Abstract for Publication No. 10-2005-0046164.
English Abstract for Publication No. 10-2008-0054629.
English Abstract for Publication No. 10-2008-0054783.
English Abstract for Publication No. 10-2011-0058076.

* cited by examiner

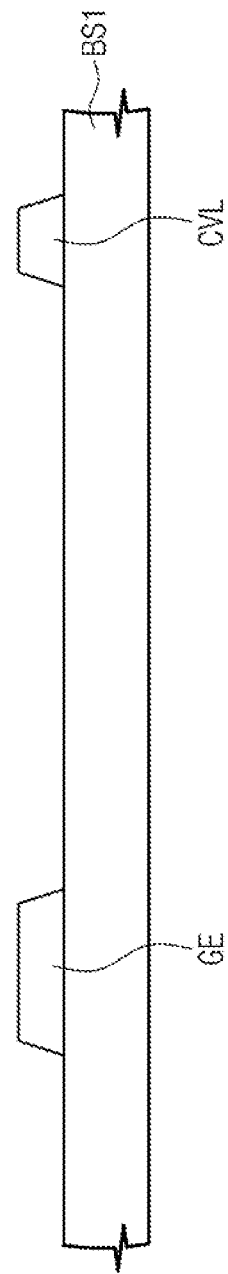

THIN FILM TRANSISTOR UNAFFECTED BY LIGHT AND DISPLAY APPARATUS HAVING THE SAME

CROSS-REFERENCE TO RELATED APPLICATION

This U.S. non-provisional patent application claims priority under 35 U.S.C. § 119 from Korean Patent Application No. 10-2012-0039237, filed on Apr. 16, 2012 in the Korean Intellectual Property Office, the contents of which are herein incorporated by reference in their entirety.

BACKGROUND

1. Technical Field

Embodiments of the present disclosure are directed to a thin film transistor and a display apparatus having the same. More particularly, embodiments of the present disclosure are directed to a bottom gate type thin film transistor and a display apparatus having a bottom gate type thin film transistor.

2. Discussion of the Related Art

A thin film transistor is used in a flat panel display apparatus, such as a liquid crystal display, an organic light emitting display, etc., as a switching device. Carrier mobility and leakage current of a thin film transistor depend on the material and the condition of a channel layer through which carriers move.

In general, the channel layer of a thin film transistor is formed of an amorphous silicon layer. The amorphous silicon thin film transistor is uniformly formed on a large substrate, but has low carrier mobility.

SUMMARY

Embodiments of the present disclosure provide a thin film transistor capable of being operated regardless of external light.

Embodiments of the present disclosure provide a display apparatus capable of being stably operated.

Embodiments of the inventive concept provide a thin film transistor that includes a gate electrode, a first insulating layer disposed to cover the gate electrode, a semiconductor layer disposed on the first insulating layer that includes a first side surface portion, a source electrode disposed on the semiconductor layer, and a drain electrode disposed on the first insulating layer that includes a second side surface portion. The first side surface portion makes contact with the second side surface portion.

The semiconductor layer is disposed between the source electrode and the first insulating layer and the drain electrode makes direct contact with an upper surface of the first insulating layer. When viewed in a plan view, an overlap area of the gate electrode with respect to the source electrode is greater than an overlap area of the gate electrode with respect to the drain electrode.

The thin film transistor further includes an etch stopper disposed between the source electrode and the drain electrode to cover an upper surface of the semiconductor layer.

The semiconductor layer includes an oxide semiconductor that includes at least one of indium (In), gallium (Ga), zinc (Zn), and tin (Sn).

Embodiments of the inventive concept provide a display apparatus that includes a display device and a thin film transistor that applies a driving signal to the display device.

The display device includes a first electrode connected to the thin film transistor, a second electrode that forms an electric field in cooperation with the first electrode, and a liquid crystal layer operated by the electric field.

The display apparatus further includes a first base substrate upon which the gate electrode is disposed, and a second base substrate facing the first base substrate with the liquid crystal layer interposed therebetween. The first electrode may be disposed on the first base substrate and the second electrode may be disposed on the second base substrate, or the first electrode and the second electrode may be disposed on the first base substrate and are insulated from each other.

Further embodiments of the inventive concept provide a thin film transistor that includes a gate electrode, a first insulating layer covering the gate electrode, a semiconductor layer disposed on the first insulating layer that overlaps at least a portion of the gate electrode, a source electrode disposed on the semiconductor layer, and a drain electrode disposed on the first insulating layer that is spaced apart from the gate electrode, wherein an overlap area of the gate electrode with respect to the source electrode is greater than an overlap area of the gate electrode with respect to the drain electrode.

According to the above, a thin film transistor according to embodiments of the inventive concept may reduce a negative shift of the threshold voltage thereof.

A display apparatus may be stably operated using a thin film transistor according to embodiments of the inventive concept. In addition, a display apparatus according to embodiments of the inventive concept may have improve brightness and definition thereof.

BRIEF DESCRIPTION OF THE DRAWINGS

FIGS. 8B, 9B, 10B, 11B, and 12B are cross-sectional views, each taken along a line I-I' shown in FIGS. 8A, 9A, 10A, 11A, and 12A.

DETAILED DESCRIPTION OF EXEMPLARY EMBODIMENTS

It will be understood that when an element or layer is referred to as being "on", "connected to" or "coupled to" another element or layer, it can be directly on, connected or coupled to the other element or layer or intervening elements or layers may be present. Like numbers refer to like elements throughout.

Hereinafter, exemplary embodiments of the present disclosure will be explained in detail with reference to the accompanying drawings.

In the present exemplary embodiment, a bottom gate type thin film transistor, in which a gate electrode is formed under a channel portion, will be described as a representative example.

Figure 1:
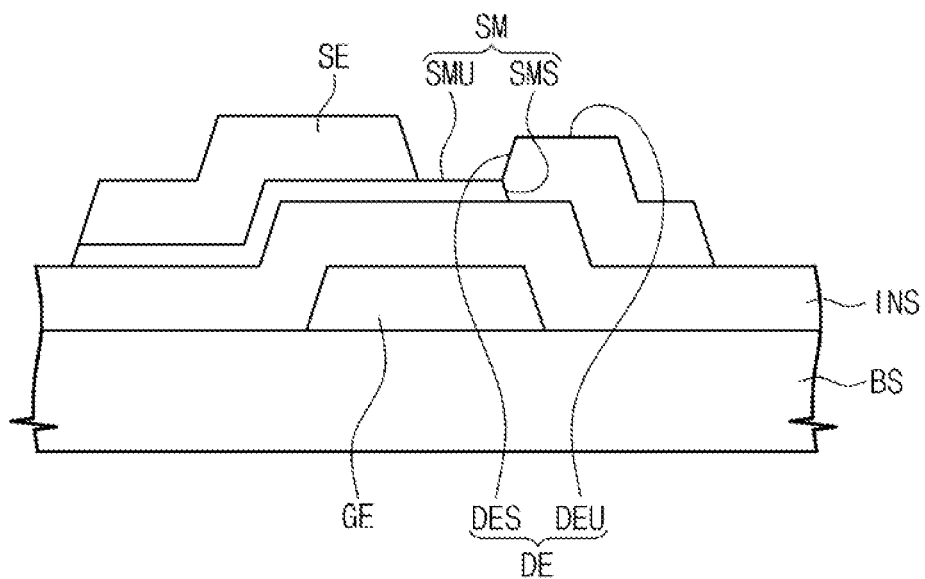
FIG. 1 is a cross-sectional view showing a thin film transistor according to an exemplary embodiment of the present disclosure.

FIG. 1 is a cross-sectional view showing a thin film transistor according to an exemplary embodiment of the present disclosure.

Referring to FIG. 1, a thin film transistor includes a gate electrode GE, a semiconductor layer SM, a source electrode SE, and a drain electrode DE.

The gate electrode GE is disposed on a base substrate BS. The base substrate BS may be, a silicon substrate, a glass substrate, or a plastic substrate, but is not limited thereto. In addition, the base substrate BS may be transparent or non-transparent.

The gate electrode GE is formed of a conductive material, such as metal. The gate electrode GE may be formed of two or more metals or alloys. In addition, the gate electrode GE may have a single-layer structure or a multi-layer structure.

An insulating layer INS is disposed on the base substrate to cover the gate electrode GE. The insulating layer INS may include an organic insulating material or an inorganic insulating material, such as silicon oxide or silicon nitride.

The semiconductor layer SM is disposed as a thin film on the insulating layer INS and covers a portion of the insulating layer INS. The semiconductor layer SM is disposed over the gate electrode GE and overlaps at least a portion of the gate electrode GE when viewed in a plan view. The semiconductor layer SM includes a first upper surface portion SMU substantially parallel with an upper surface of the insulating layer INS and a first side surface portion SMS that connects the first upper surface portion SMU and the insulating layer INS. The first upper surface portion SMU is substantially parallel with an upper surface of the base substrate BS and the first side surface portion SMS is vertical to or inclined with respect to the upper surface of the insulating layer INS.

The semiconductor layer SM may include an oxide semiconductor. The oxide semiconductor includes at least one of indium (In), gallium (Ga), zinc (Zn), and tin (Sn). For example, the semiconductor layer SM may include an oxide semiconductor such as zinc oxide, tin oxide, indium oxide, indium-zinc (In—Zn) oxide, indium-tin (In—Sn) oxide, indium-gallium-zinc (In—Ga—Zn) oxide, indium-zinc-tin (In—Zn—Sn) oxide, indium-gallium-zinc-tin (In—Ga—Zn—Sn) oxide, etc.

The source electrode SE is directly disposed on the first upper surface portion SMU to cover at least a portion of the first upper surface portion SMU of the semiconductor layer SM.

The drain electrode DE is disposed on the insulating layer INS and is spaced apart from the source electrode SE. The drain electrode DE includes a second upper surface portion DEU substantially parallel with the upper surface of the drain electrode DE and a second side surface portion DES that connects the second upper surface portion DEU and the insulating layer INS. The second upper surface portion DEU is substantially parallel with the upper surface of the base substrate BS and the second side surface portion DES is vertical to or inclined to the upper surface of the insulating layer INS.

The first side surface portion SMS of the semiconductor layer SM and the second side surface portion DES of the drain electrode DE contact each other. The drain electrode DE is not substantially disposed on the first upper surface portion SMU of the semiconductor layer SM. That is, when viewed in a plan view, the source electrode SE overlaps a portion of the semiconductor layer SM, but the drain electrode DE either does not substantially overlap the semiconductor layer SM or has a small overlap area with respect to the semiconductor layer SM. A portion of the semiconductor layer SM disposed between the source electrode SE and the drain electrode DE serves as a channel portion in which a conductive channel is formed when a gate-on signal is applied to the gate electrode GE.

The source electrode SE and the drain electrode DE may be formed of a conductive material, such as a metal. Each of the source electrode SE and the drain electrode DE may be formed of a single metal, two or more metals, or a metal alloy. In addition, each of the source electrode SE and the drain electrode DE may have a single-layer structure or a multi-layer structure.

At least a portion of the source electrode SE is disposed on the semiconductor layer SM, but the drain electrode DE is disposed on the insulating layer INS. Accordingly, a distance between the upper surface of the base substrate BS and the upper surface of the source electrode SE is greater than a distance between the upper surface of the base substrate BS and the upper surface of the drain electrode DE.

Figure 2A:
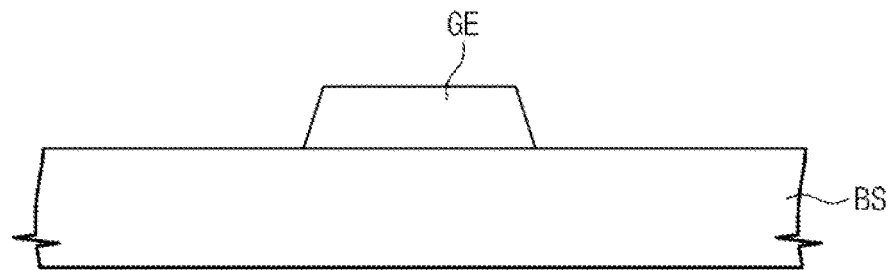
FIGS. 2A to 2C are cross-sectional views showing a method of manufacturing a thin film transistor according to an exemplary embodiment of the present disclosure.
Figure 2B:
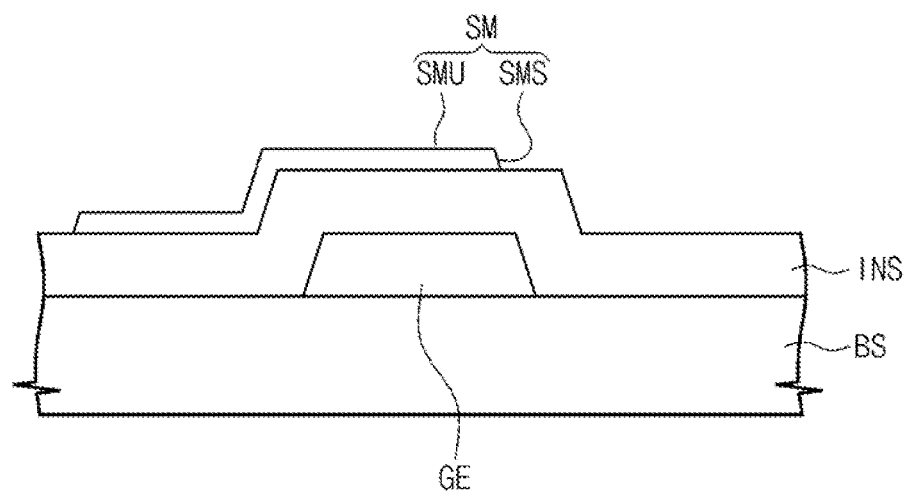
Figure 2C:
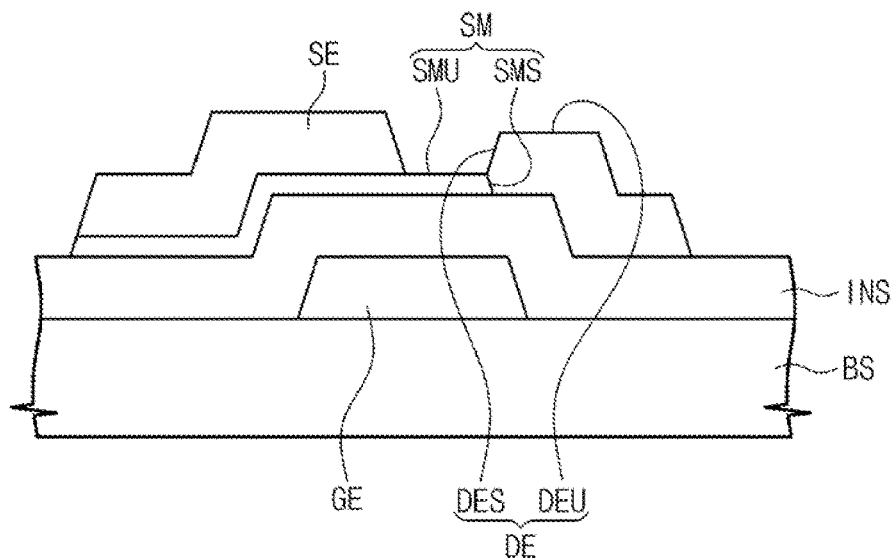

FIGS. 2A to 2C are cross-sectional views showing a method of manufacturing a thin film transistor according to an exemplary embodiment of the present disclosure.

Referring to FIG. 2A, the gate electrode GE is formed on the base substrate BS.

The gate electrode GE is formed by forming a conductive layer on the base substrate BS using a conductive material and patterning the conductive layer using a photolithography process. The conductive material may include a single metal, two or more metals, or a metal alloy. In addition, the gate electrode GE may be formed to have the single-layer or multi-layer structure using the conductive material.

Referring to FIG. 2B, the insulating layer INS is formed on the base substrate BS to cover the gate electrode GE and the semiconductor layer SM is formed on the insulating layer INS and covers a portion of the insulating layer INS.

The insulating layer INS is formed by depositing an insulating material over the base substrate BS The semiconductor layer SM may include an oxide layer. The oxide layer includes at least one of indium (In), gallium (Ga), zinc (Zn), and tin (Sn). The semiconductor layer SM is formed by depositing the oxide layer over the insulating layer INS and patterning the oxide layer using a photolithography process.

Referring to FIG. 2C, the source electrode SE and the drain electrode DE are formed over the base substrate BS on which the semiconductor layer SM is formed.

The source electrode SE and the drain electrode DE may be formed of a conductive material, such as a metal. For example, the source electrode SE and the drain electrode DE may be formed by forming a metal layer over the base substrate BS and patterning the metal layer through a photolithography process using one mask. Each of the source electrode SE and the drain electrode DE may be a single-layer structure of the single metal or the metal alloy, but they are not be limited thereto. That is, each of the source electrode SE and the drain electrode DE may have a multi-layer structure of two or more metals and/or the alloy thereof. In a present exemplary embodiment, the metal layer is patterned such that an end portion of the drain electrode DE, which faces the source electrode SE, makes contact with only the side surface portion SMS of the semiconductor layer SM.

Figure 3:
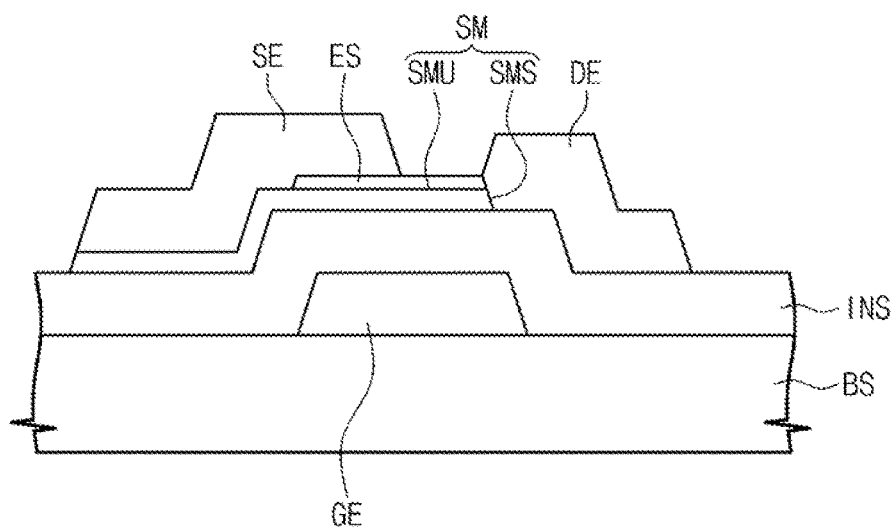
FIG. 3 is a cross-sectional view showing a thin film transistor according to another exemplary embodiment of the present disclosure.

FIG. 3 is a cross-sectional view showing a thin film transistor according to another exemplary embodiment of the present disclosure. In FIG. 3, the same reference numerals denote the same elements as in FIG. 1, and thus detailed descriptions of the same elements will be omitted.

In a thin film transistor according to another exemplary embodiment, an etch stopper ES is provided between the source electrode SE and the drain electrode DE. The etch stopper ES prevents the semiconductor layer SM from being etched. The etch stopper ES is formed by forming an insulating layer on the semiconductor layer SM using an insulating material before the source electrode SE and the drain electrode DE are formed and patterning the insulating layer using a photolithography process. The etch stopper ES covers an area between the source electrode SE and the drain electrode DE. After forming the etch stopper ES, the source electrode SE and the drain electrode DE are formed and the etch stopper ES prevents the upper surface of the semiconductor layer SM from being etched when the source and drain electrodes SE and DE are formed by the photolithography process, thereby preventing defects in the channel portion.

A thin film transistor according to an embodiment of the present disclosure may reduce a negative shift of the threshold voltage.

The negative shift of the threshold voltage is caused by a light negative bias thermal stress (LNBTS). In detail, electrons excited by light are concentrated in a channel portion, in which the gate electrode and the drain electrode overlap each other, according to the defect states of the oxide semiconductor. The amorphous oxide semiconductor contains oxygen vacancies whose density of states (DOS) in a forbidden band of a semiconductor band gap is determined by the degree of oxygen vacancies, so that the carriers may be accommodated in the forbidden band, causing the negative shift of the threshold voltage.

Accordingly, when external light reaches the interfacial surface between the channel portion and the insulating layer, the electrons are trapped into acceptor-like states near a conduction band from the DOS in the forbidden band or hopped into the conduction band, causing a negative shift of the threshold voltage. That is, electrons excited by absorbing light from the external light pile up in an area in which the gate electrode and the drain electrode overlap each other. In this case, due to a horizontal electric field formed between the source electrode and the drain electrode, the electrons are mainly concentrated close to the drain electrode, and the area in which the electrons are concentrated expands to the source electrode from the drain electrode in accordance with the degree of electron pile-up. As a result, the threshold voltage of the thin film transistor is negatively shifted by the piled-up electrons.

According to the above-mentioned thin film transistors, the gate electrode and the drain electrode either do not overlap each other in the channel portion, or if overlapped with each other, have a smaller overlap area than the gate electrode with respect to the source electrode. Thus, the electron pile-up may be prevented or reduced and the LNBTS may be prevented or reduced, thereby reducing the negative shift of the threshold voltage. In addition, when a voltage is applied to the gate electrode, a current flows along the interfacial surface between the insulating layer and the semiconductor layer, and the drain electrode makes direct contact with the lower portion of the semiconductor layer. Therefore, the electrons may be easily swept by the current.

Figure 4:
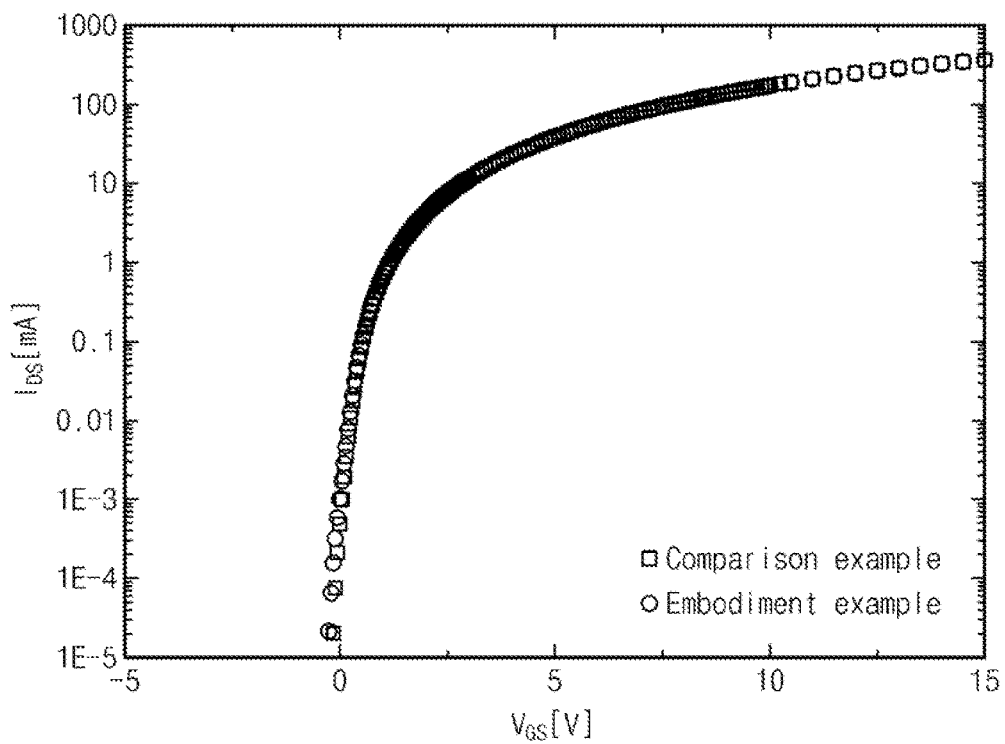
FIG. 4 is a graph showing a current Ids flowing between a drain electrode and a source electrode as a function of a gate voltage Vgs in a conventional thin film transistor and a thin film transistor according to an exemplary embodiment of the present disclosure.

FIG. 4 is a graph showing a current Ids flowing between a drain electrode and a source electrode as a function of a gate voltage Vgs in a conventional thin film transistor and a thin film transistor according to an exemplary embodiment of the present disclosure.

Referring to FIG. 4, the current vs. voltage graph for the thin film transistor according to the exemplary embodiment of the present disclosure agrees with the current vs. voltage graph for a conventional thin film transistor. That is, a voltage-current property of a thin film transistor according to the exemplary embodiment of the present disclosure is the same as that of a conventional thin film transistor.

Figure 5:
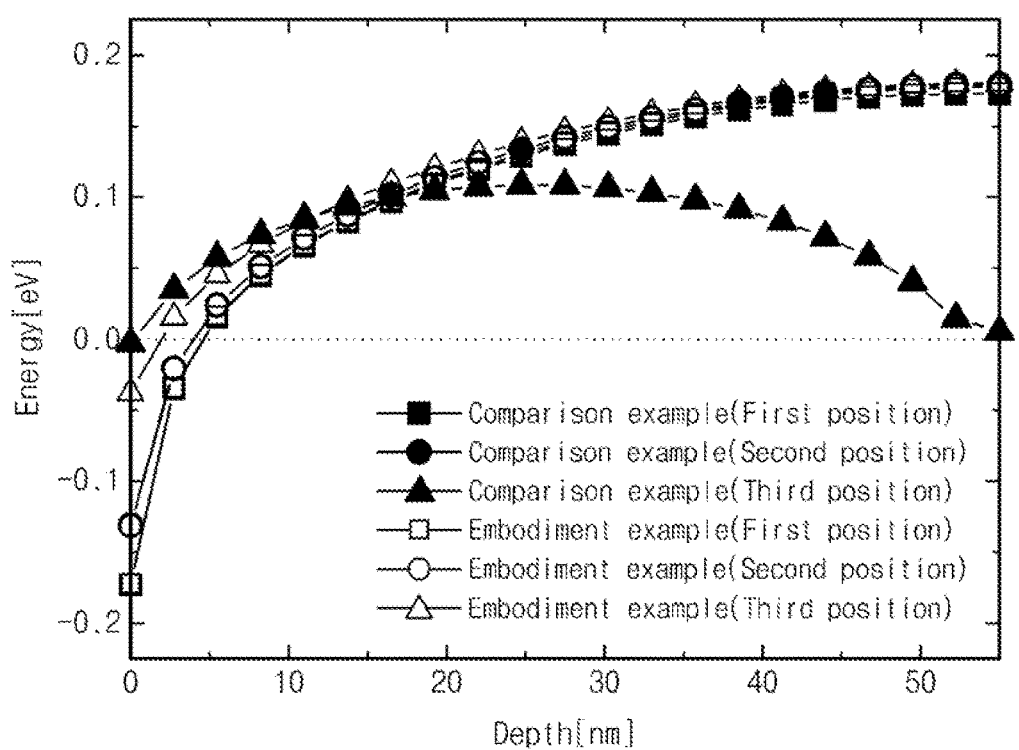
FIG. 5 is a graph showing a conduction band energy level as a function of channel portion depth in a conventional thin film transistor and a thin film transistor according to an exemplary embodiment of the present disclosure.

FIG. 5 is a graph showing a conduction band energy level as a function of channel portion depth in a conventional thin film transistor and a thin film transistor according to an exemplary embodiment of the present disclosure. In FIG. 5, graphs for the comparison examples represent a measured value for conventional thin film transistors, graphs for embodiment examples represent a measured value for a thin film transistor according to the present disclosure, and the gate-source voltage Vgs and the drain-source voltage Vds are each about 10 volts. A first position refers to a point in an area where the source electrode and the gate electrode overlap each other, a second position refers to a point in an area where the drain electrode and the gate electrode overlap each other, and a third position refers to an area between the first position and the second position, where the gate electrode does not overlap the source electrode and the drain electrode. In FIG. 5, the depth of the channel portion is measured from the surface of the semiconductor layer.

Referring to FIG. 5, there is no difference in the energy levels at the first and second positions as a function of channel portion depth between a conventional thin film transistor and a thin film transistor according to the exemplary embodiment. However, in case of a conventional thin film transistor, the energy level at the third position decreases as the depth increases. This is because the electrons are concentrated at the third position. On the other hand, for a thin film transistor according to an exemplary embodiment, the energy level at the third position does not decrease. As a result, a thin film transistor according to an exemplary embodiment has substantially the same energy level at the first, second, and third positions, and thus the negative shift does not occur.

A thin film transistor according to an exemplary embodiment may be employed in various electronic devices, such as a display apparatus. According to an exemplary embodiment, a display apparatus includes a display device and a thin film transistor that applies a driving signal to the display device. In this case, the display apparatus may include a thin film transistor as described above and shown in FIG. 1 or 3.

The display device may include a display layer operated by the thin film transistor to display an image. The display layer may be, a liquid crystal layer, an electrophoretic layer, an electrowetting layer, etc, but is not limited thereto.

Figure 6:
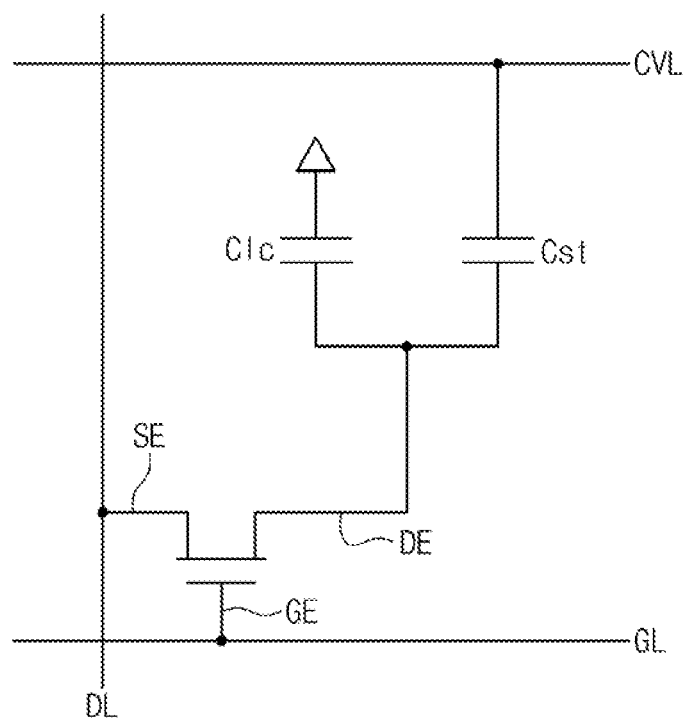
FIG. 6 is a circuit diagram showing a liquid crystal display according to an exemplary embodiment of the present disclosure.
Figure 7A:
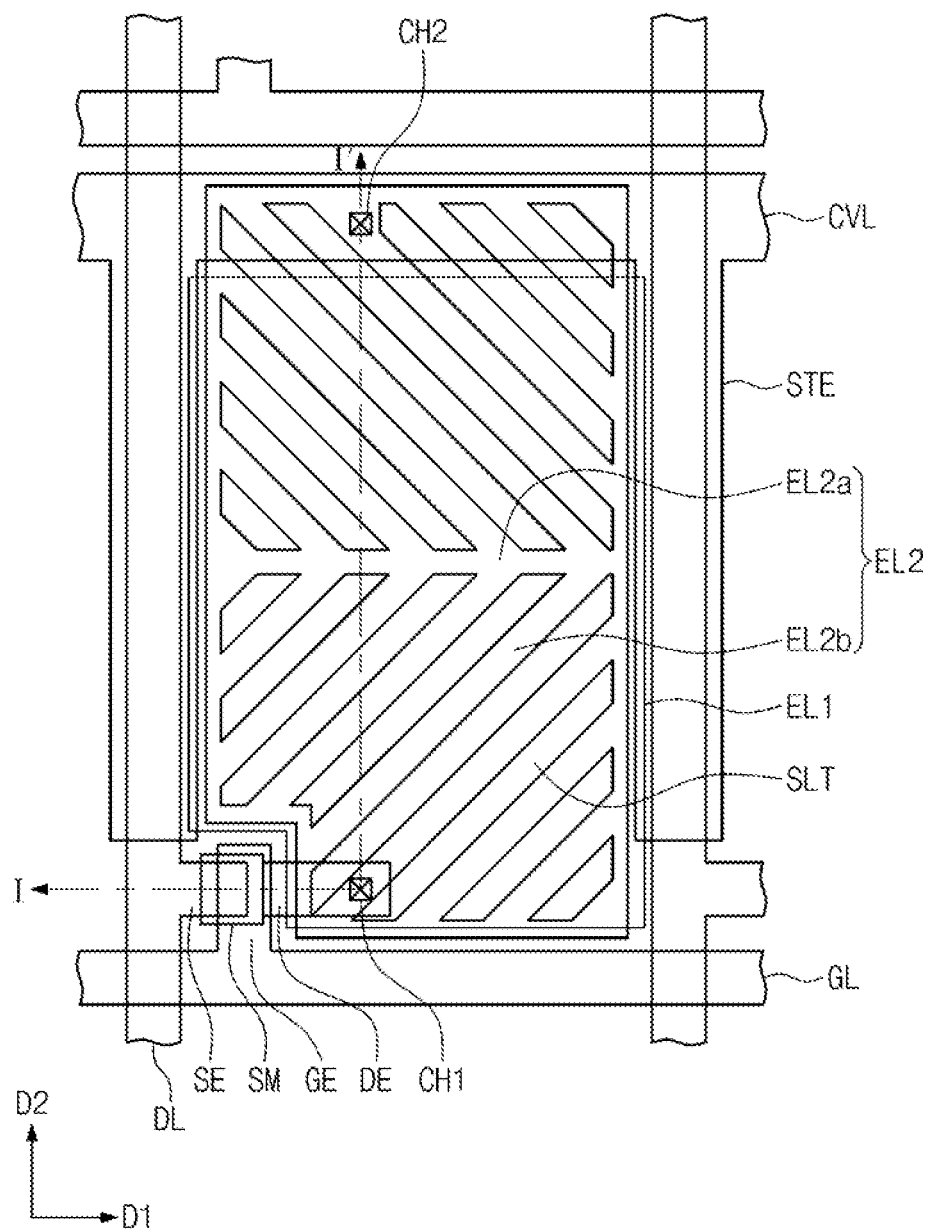
FIG. 7A is a plan view showing a liquid crystal display according to an exemplary embodiment of the present disclosure.
Figure 7B:
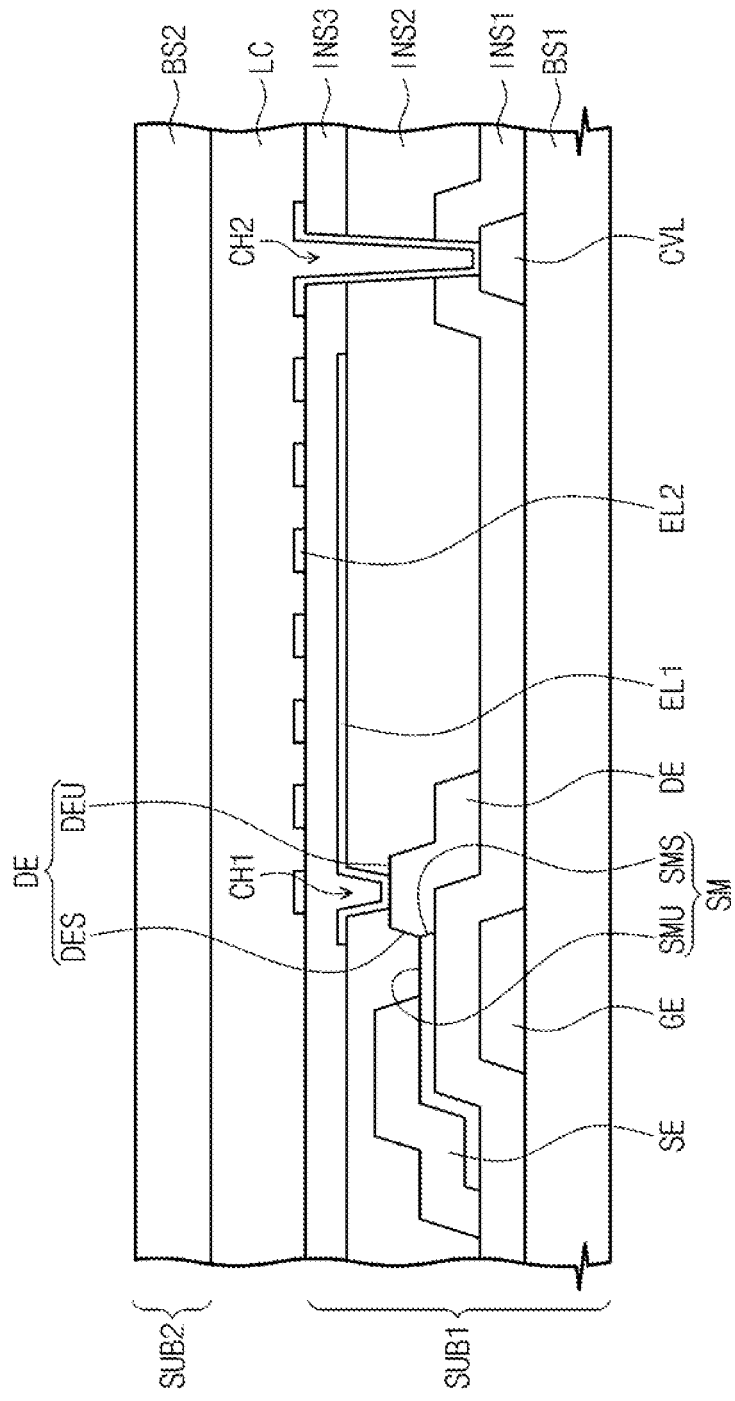
FIG. 7B is a cross-sectional view taken along a line I-I' of FIG. 7A.

FIG. 6 is a circuit diagram showing a liquid crystal display according to an exemplary embodiment of the present disclosure, FIG. 7A is a plan view showing a liquid crystal display according to an exemplary embodiment of the present disclosure, and FIG. 7B is a cross-sectional view taken along a line I-I' of FIG. 7A. A liquid crystal display according to a present exemplary embodiment includes a plurality of signal lines and a plurality of pixels respectively connected to the signal lines and arranged in a matrix form. FIGS. 6, 7A, and 7B show one pixel as a representative example.

Referring to FIG. 6, the signal lines include a plurality of gate lines to transmit a gate signal and a plurality of data lines to transmit a data signal. The gate lines extend in a first direction, such as a row direction, and the data lines extend in a second direction, such as a column direction.

Each pixel is connected to a single gate line GL and a single data line DL. The pixel includes a thin film transistor, a liquid crystal capacitor Clc, and a storage capacitor Cst. The thin film transistor includes a gate electrode GE connected to the gate line GL, a source electrode SE connected to the data line DL, and a drain electrode DE connected to the liquid crystal capacitor Clc and the storage capacitor Cst connected to a common voltage line CVL.

When a gate signal is applied to the gate electrode GE of the thin film transistor, the thin film transistor is turned on and a data signal is charged in the liquid crystal capacitor Clc and the storage capacitor Cst, which are connected to the drain electrode DE of the thin film transistor. The storage capacitor Cst is charged with the data signal and maintained at the charged level after the thin film transistor is turned off.

Referring to FIGS. 7A and 7B, the liquid crystal display includes a first substrate SUB1, a second substrate SUB2 facing the first substrate SUB1, and a liquid crystal layer LC disposed between the first substrate SUB1 and the second substrate SUB2.

The first substrate SUB1 includes a first base substrate BS1. The first base substrate BS1 has a rectangular shape and is formed of a transparent insulating material.

The gate line GL, the data line DL, and the common voltage line CVL are disposed on the first base substrate BS1.

The gate line GL extends in the first direction D1, and the common voltage line CVL extends in the first direction D1 spaced apart from the gate line GL. The common voltage line CVL includes a storage electrode STE branched from the common voltage line CVL. The storage electrode STE extends in the second direction D2 crossing the first direction D1.

A first insulating layer INS1 is disposed on the first base substrate BS1 on which the gate line GL and the common voltage line CVL are formed. The first insulating layer INS1 includes an insulating material, such as silicon nitride, silicon oxide, etc.

The data line DL extends in the second direction D2 and is insulated from the gate line GL and the common voltage line CVL by the first insulating layer INS1 interposed therebetween.

A plurality of thin film transistors is disposed on the first base substrate BS1, and each thin film transistor is connected to a corresponding gate line GL and a corresponding data line DL. The thin film transistor includes the gate electrode GE, the first insulating layer INS1, the semiconductor layer SM, the source electrode SE, and the drain electrode DE.

The gate electrode GE protrudes from the gate line GL or is disposed on a portion of the gate line GL. The gate line GL and the gate electrode GE are formed of metal. The metal may include nickel, chromium, molybdenum, aluminum, titanium, copper, tungsten, or an alloy thereof. The gate electrode GE may have a single-layer structure or a multi-layer structure of the above-mentioned metals. For example, the gate electrode GE may have a triple-layer structure of molybdenum, aluminum, and molybdenum, which are sequentially stacked on one another, a double-layer structure of titanium and copper sequentially stacked, or a single-layer structure of an alloy of titanium and copper.

The first insulating layer INS1 is disposed over the first base substrate BS1 to cover the gate electrode GE and the common voltage line CVL.

The semiconductor layer SM is disposed as a thin film on the first insulating layer INS1 and covers a portion of the first insulating layer INS1. The semiconductor layer SM is disposed over the gate electrode GE and overlaps at least a portion of the gate electrode GE when viewed in a plan view. The semiconductor layer SM includes an upper surface portion SMU substantially parallel with an upper surface of the first insulating layer INS1 and a side surface portion SMS that connects the upper surface portion SMU and the first insulating layer INS1. The upper surface portion SMU is substantially parallel with an upper surface of the first base substrate BS1 and the side surface portion SMS is vertical to or inclined to the upper surface of the first insulating layer INS1.

The semiconductor layer SM may include an oxide semiconductor. The oxide semiconductor includes at least one of indium (In), gallium (Ga), zinc (Zn), and tin (Sn). For example, the semiconductor layer SM may include an oxide semiconductor such as zinc oxide, tin oxide, indium oxide, indium-zinc (In—Zn) oxide, indium-gallium-zinc (In—Ga—Zn) oxide, indium-zinc-tin (In—Zn—Sn) oxide, indium-gallium-zinc-tin (In—Ga—Zn—Sn) oxide, etc.

The source electrode SE is directly disposed on the first upper surface portion SMU to cover a portion of the first upper surface portion SMU of the semiconductor layer SM. The drain electrode DE is disposed on the first insulating layer INS and is spaced apart from the source electrode SE. The drain electrode DE makes direct contact with the side surface portion SMS but is not disposed on the upper surface portion SMU of the semiconductor layer SM. That is, when viewed in a plan view, the source electrode SE overlaps a portion of the semiconductor layer SM, but the drain electrode DE either does not overlap the semiconductor layer SM, or overlaps a small area of the semiconductor layer SM. A portion of the semiconductor layer SM disposed between the source electrode SE and the drain electrode DE serves as a channel portion in which a conductive channel is formed when a gate-on signal is applied to the gate electrode GE.

The source electrode SE and the drain electrode DE may be formed of a conductive material, such as a metal. The source electrode SE and the drain electrode DE may each be formed of a single metal, two or more metals, or a metal alloy. For example, the source electrode SE and the drain electrode DE may each include nickel, chromium, molybdenum, aluminum, titanium, copper, tungsten, or an alloy thereof. In addition, the source electrode SE and the drain electrode DE may each have a single-layer structure or a multi-layer structure. For example, the source and drain electrodes SE and DE may each have a double-layer structure of titanium and copper.

At least a portion of the source electrode SE is disposed on the semiconductor layer SM, but the drain electrode DE is disposed on the insulating layer INS. Accordingly, a distance between the upper surface of the first base substrate BS1 and the upper surface of the source electrode SE is greater than a distance between the upper surface of the first base substrate BS1 and the upper surface of the drain electrode DE.

A second insulating layer INS2 is disposed on the first base substrate BS1 to cover the thin film transistor.

A first electrode EL1 is disposed on the second insulating layer INS2. The first electrode EL1 may be provided as an integrally-formed single body plate. The second insulating layer INS2 includes a first contact hole CH1 formed therethrough to expose a portion of the drain electrode DE and through which the first electrode EL1 is connected to the drain electrode DE. The first electrode EL1 is formed of a transparent conductive material. In particular, the first electrode EL1 is formed of a transparent conductive oxide, such as indium tin oxide (ITO), indium zinc oxide (IZO), indium tin zinc oxide (ITZO), etc.

The first electrode EL1 overlaps a portion of the storage electrode STE. The first electrode EL1 forms a storage capacitor in cooperation with the storage electrode STE with the first and second insulating layers INS1 and INS2 interposed therebetween.

A third insulating layer INS3 is disposed on the first electrode EL1. The third insulating layer INS3 covers the channel portion and the first electrode EL1. The third insulating layer INS3 may include silicon nitride or silicon oxide.

A second electrode EL2 is disposed on the third insulating layer INS3. The second electrode EL2 is formed of a transparent conductive material. In particular, the second electrode EL2 is formed of a transparent conductive oxide, such as indium tin oxide (ITO), indium zinc oxide (IZO), indium tin zinc oxide (ITZO), etc.

The second electrode EL2 overlaps a portion of the first electrode EL1. The second electrode EL2 includes a plurality of slits SLT. The slits SLT are inclined with respect to the first direction D1 or the second direction D2. In addition, the second electrode EL2 includes a plurality of regions in which the slits SLT are inclined in different directions with respect to each other. In this case, the regions are substantially axisymmetric with respect to an imaginary line crossing the pixel or are substantially point-symmetric with respect to a position of the pixel. As an example, FIG. 1 shows slits SLT that are substantially axisymmetric with respect to an imaginary line crossing the pixel along the first direction D1.

In other words, the second electrode EL2 includes a trunk portion EL2a formed in each pixel and a plurality of branches EL2b provided from the trunk portion EL2a and separated by the slits SLT. The branches EL2b are spaced apart from each other at regular intervals. The branches EL2b of the second electrode EL2 form a fringe electric field together with the first electrode EL1. The branches EL2b extend in a predetermined direction and are substantially parallel to each other. The trunk portion EL2a and the branches EL2b may have various shapes. For example, the branches EL2b may be inclined with respect to the direction in which the trunk portion EL2a extends and with respect to a direction perpendicular to the extension direction of the trunk portion EL2a. Further, the trunk portion EL2a may have several bends.

The second electrode EL2 may be formed of a transparent conductive material. In detail, the second electrode EL2 may be formed of a conductive metal oxide such as indium tin oxide (ITO), indium zinc oxide (IZO), indium tin zinc oxide (ITZO), etc.

In addition, the first insulating layer INS1, the second insulating layer INS2, and the third insulating layer INS3 include a second contact hole CH2 formed therethrough to expose a portion of the common voltage line CVL. The second electrode EL2 is connected to the common voltage line CVL through the second contact hole CH2. The second electrode EL2 may be applied with a common voltage through the common voltage line CVL.

The second substrate SUB2 includes a second base substrate BS2 and further includes color filters (not shown). The color filters filter the light passing through a liquid crystal layer LC to have colors. The color filters include a red color filter, a green color filter, and a blue color filter. The red, green, and blue color filters are arranged to correspond to the pixels in one-to-one correspondence.

The liquid crystal layer LC including liquid crystal molecules is disposed between the first substrate SUB1 and the second substrate SUB2.

FIGS. 8A, 9A, 10A, 11A, and 12A are plan views showing a method of manufacturing a display apparatus according to embodiments of the present disclosure, and FIGS. 8B, 9B, 10B, 11B, and 12B are cross-sectional views, each taken along a line I-I' shown in FIGS. 8A, 9A, 10A, 11A, and 12A.

Figure 8A:
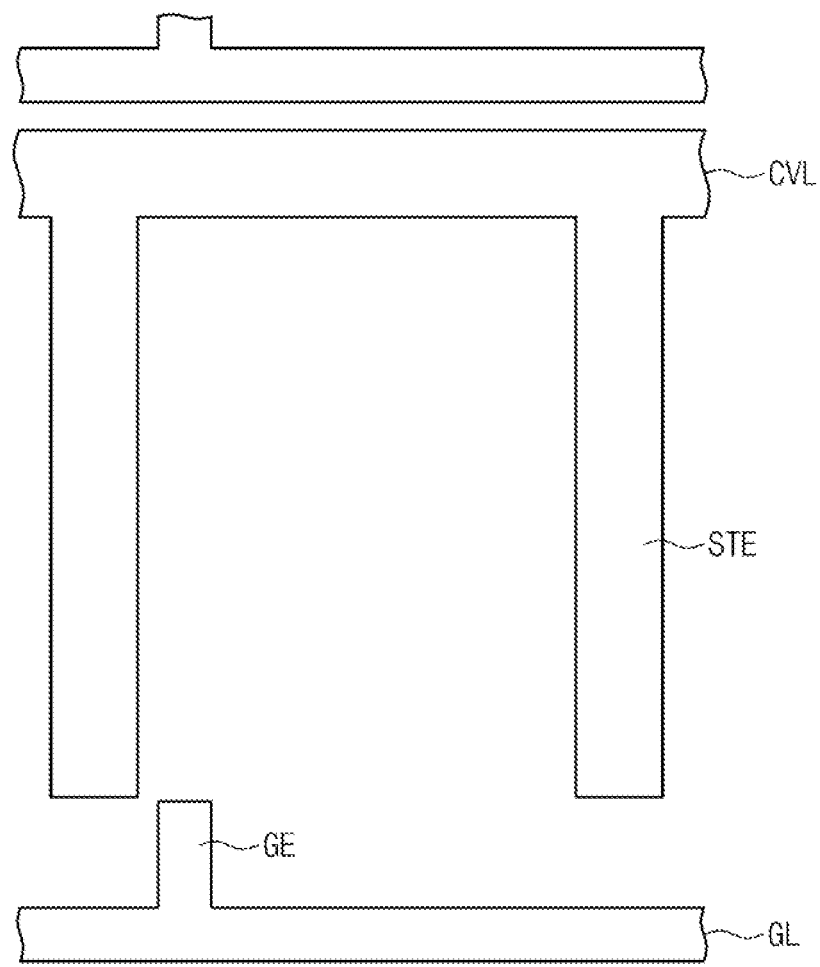
FIGS. 8A, 9A, 10A, 11A, and 12A are plan views showing a method of manufacturing a display apparatus according to the present disclosure.

Referring to FIGS. 8A and 8B, a gate line part is formed on the first base substrate BS1. The gate line part includes the gate line GL, the gate electrode GE, the common voltage line CVL, and the storage electrode STE.

The gate line part is formed of a conductive material, such as a metal. For example, the gate line part is formed by forming a metal layer over the first base substrate BS1 and patterning the metal layer using a photolithography process. The gate line part may have a single-layer structure of a single metal or a metal alloy, but is not limited to a single-layer structure. That is, the gate line part may have a multi-layer structure of two or more metals and/or the alloy thereof.

Figure 9A:
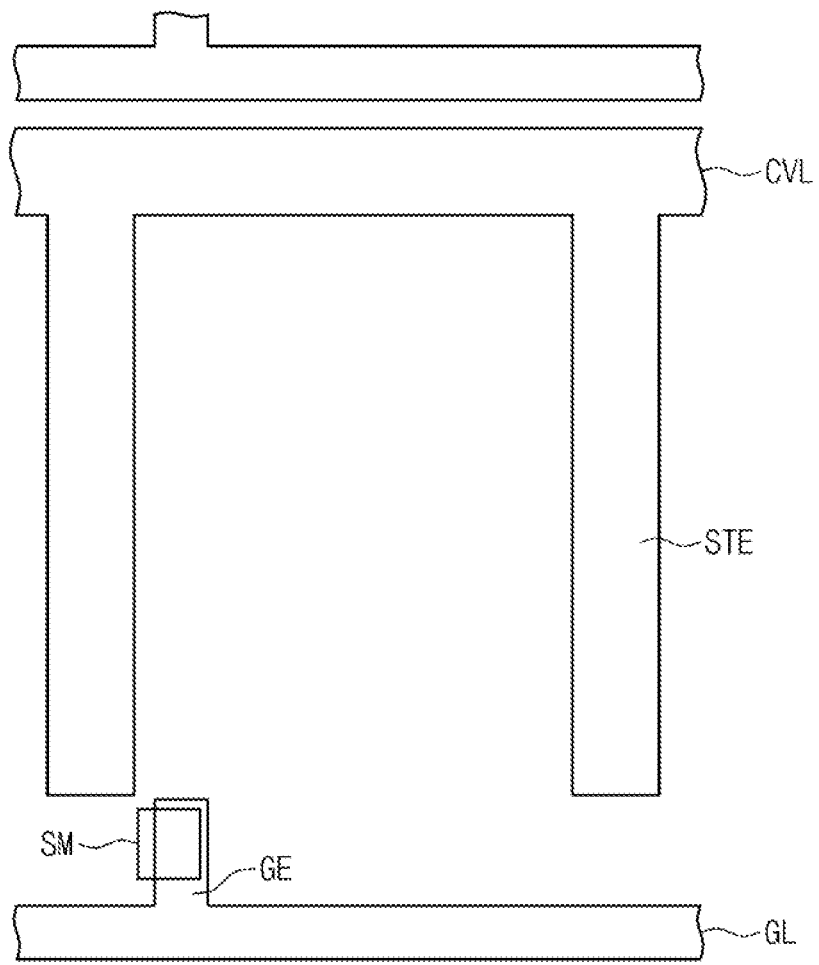
Figure 9B:
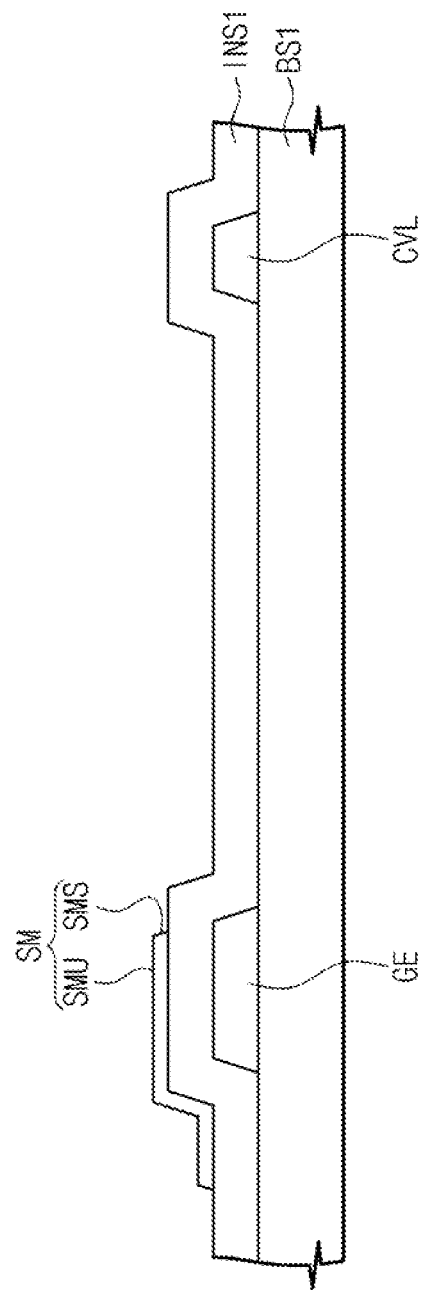

Referring to FIGS. 9A and 9B, the first insulating layer INS1 is formed on the gate line part and the semiconductor layer SM is formed on the first insulating layer INS1 and covers a portion of the first insulating layer INS1. The semiconductor layer SM is disposed above the gate electrode GE and overlaps at least a portion of the gate electrode GE when viewed in a plan view.

The semiconductor layer SM includes an oxide material that includes at least one of indium (In), gallium (Ga), zinc (Zn), and tin (Sn). The semiconductor layer SM is formed by forming an oxide layer on the first insulating layer INS1 using an oxide material and patterning the oxide layer using a photolithography process.

Figure 10A:
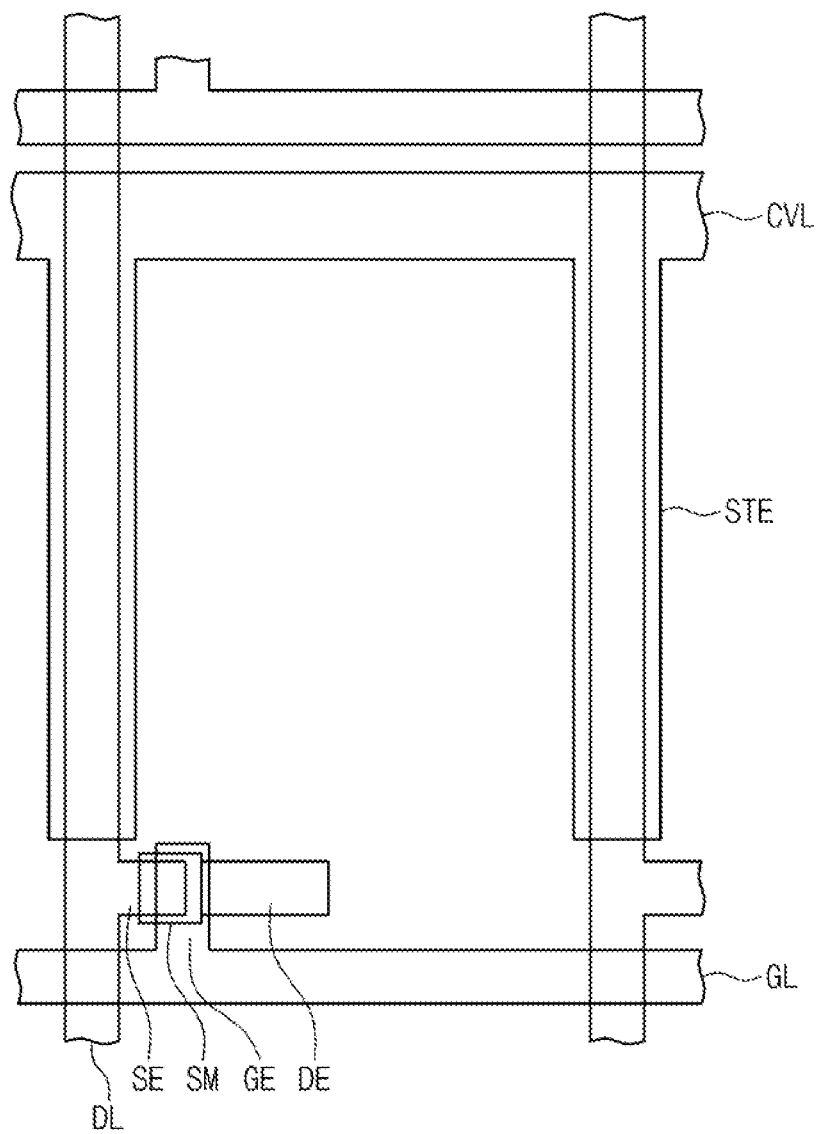
Figure 10B:
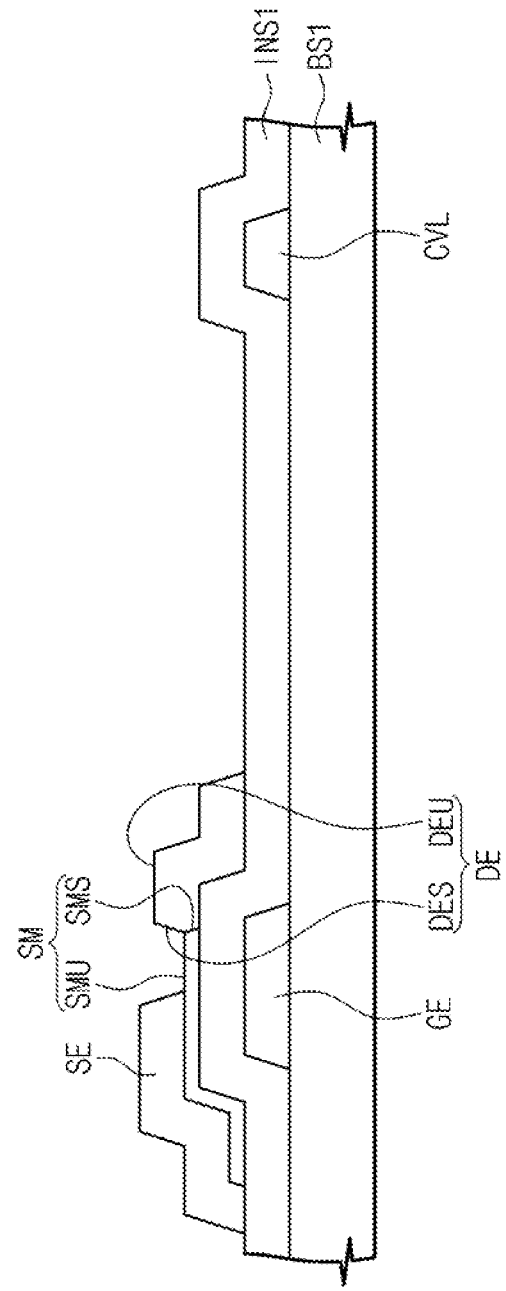

Referring to FIGS. 10A and 10B, a data line part is formed on the semiconductor layer SM. The data line part includes the data line DL, the source electrode SE, and the drain electrode DE.

The data line part is formed of a conductive material, such as a metal. For example, the data line part is formed by forming a metal layer over the first insulating layer INS1 and semiconductor layer SM and patterning the metal layer using a photolithography process. The data line part may have a single-layer structure of a single metal or a metal alloy, but is not limited to the single-layer structure. That is, the data line part may have a multi-layer structure of two or more metals and/or the alloy thereof.

In a present exemplary embodiment, the source electrode SE is formed on the upper surface portion SMU to cover the portion of the upper surface portion SMU of the semiconductor layer SM. The drain electrode DE is disposed on the first insulating layer INS1 and is spaced apart from the source electrode SE. The drain electrode DE makes direct contact with the side surface portion SMS of the semiconductor layer SM and is not disposed on the upper surface portion SMU of the semiconductor layer SM. That is, when viewed in a plan view, the source electrode SE overlaps a portion of the semiconductor layer SM, but the drain electrode DE either does not overlap the semiconductor layer SM, or has a small overlap area with respect to the semiconductor layer SM.

Figure 11A:
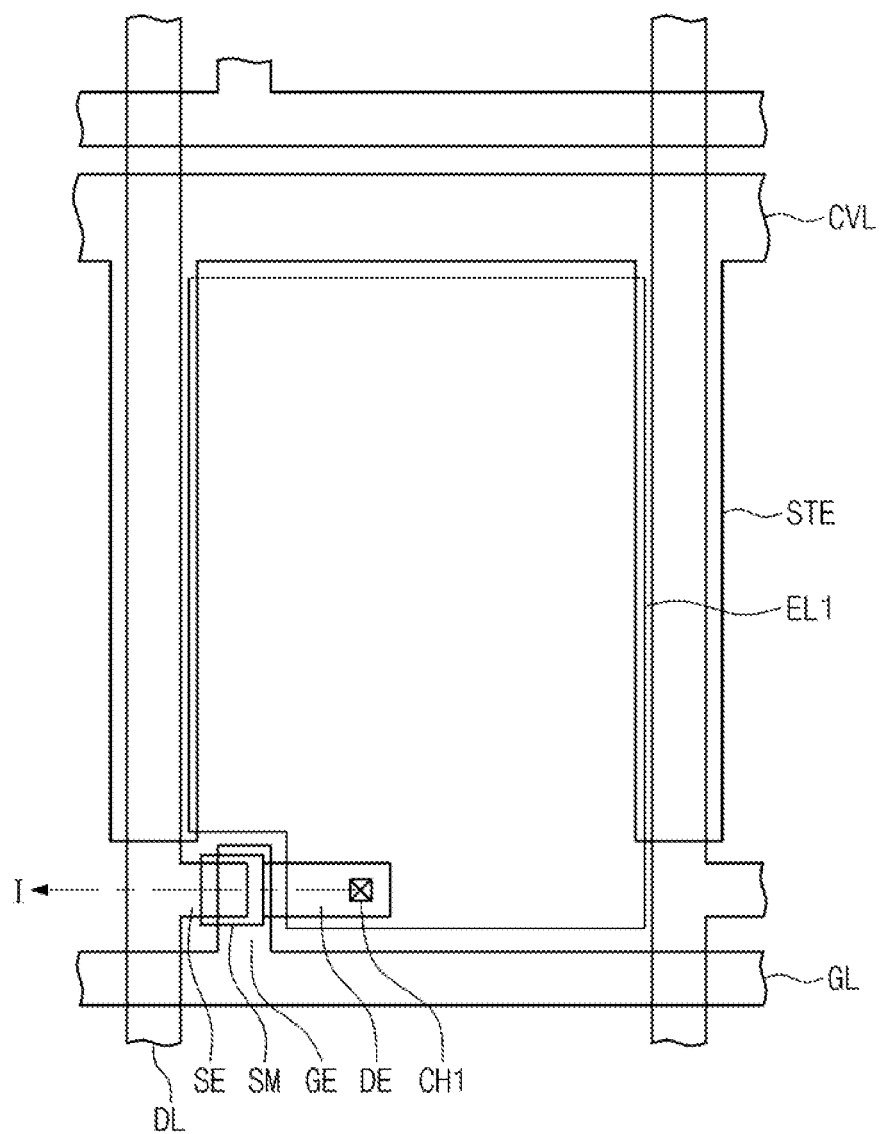
Figure 11B:
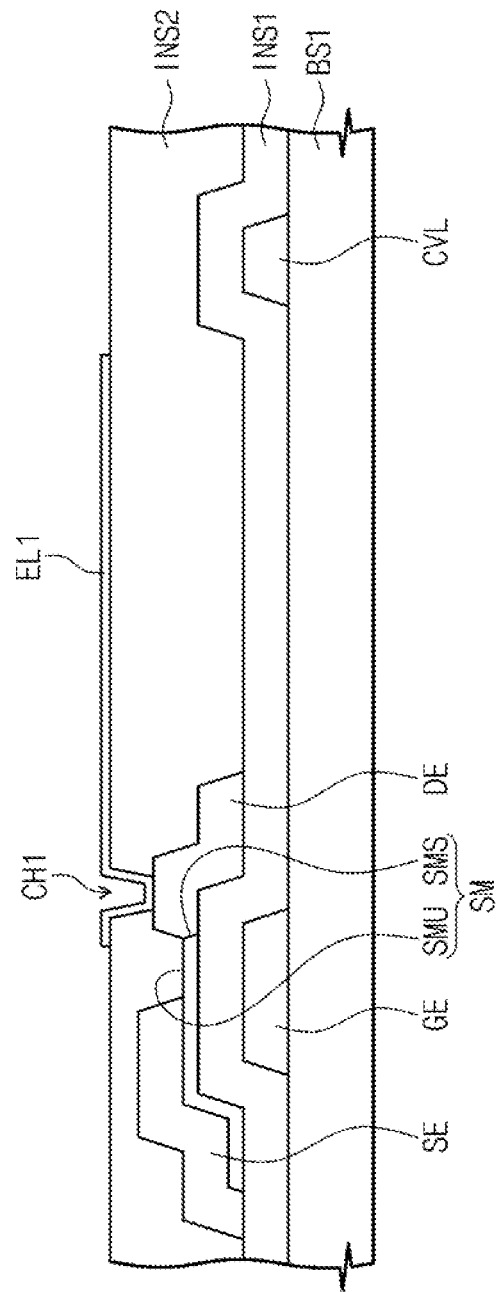

Referring to FIGS. 11A and 11B, the second insulating layer INS2 is formed on the first insulating layer INS1 to cover the data line part and the first electrode EL1 is formed on the second insulating layer INS2.

The second insulating layer INS2 may be formed by depositing an insulating material. The second insulating layer INS2 includes the first contact hole CH1 to expose a portion of the drain electrode DE and the first contact hole CH1 may be formed using a photolithography process.

The first electrode EL1 is formed by forming a conductive layer on the second insulating layer INS2 using a conductive material and patterning the conductive layer using a photolithography process. The first electrode EL1 is connected to the drain electrode DE through the first contact hole CH1.

Figure 12A:
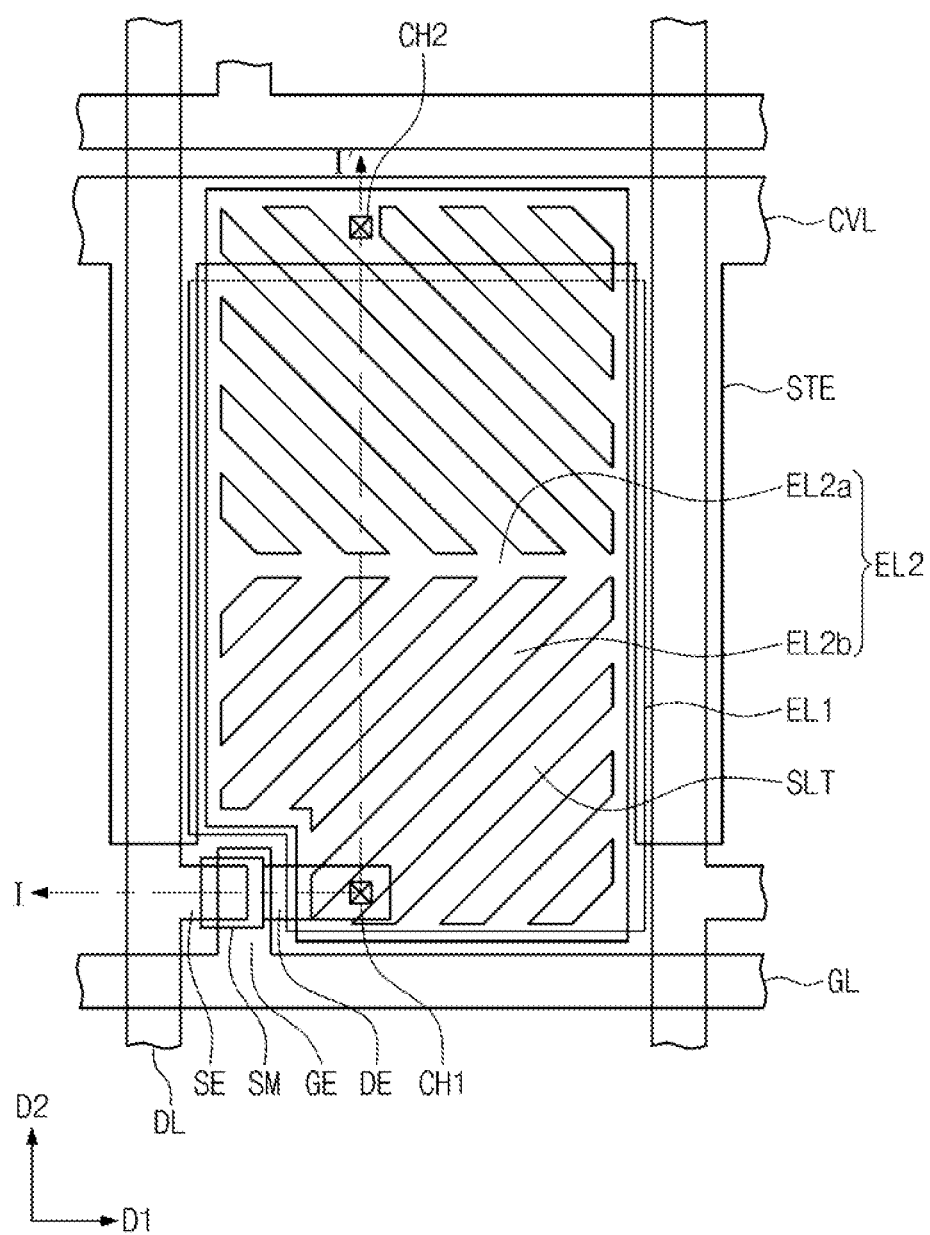
Figure 12B:
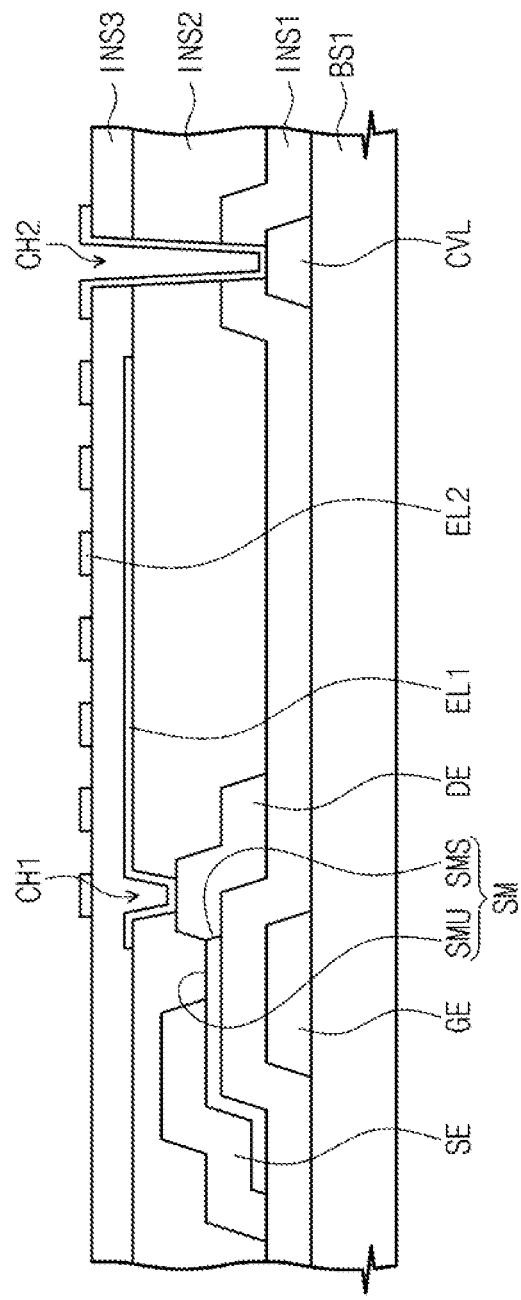

Referring to FIGS. 12A and 12B, the third insulating layer INS3 is formed on the second insulating layer INS2 to cover the first electrode EL1, and the second electrode EL2 is formed on the third insulating layer INS3.

The third insulating layer INS3 is formed by depositing an insulating material. The third insulating layer INS3 includes a second contact hole CH2 to expose a portion of the common voltage line CVL, and the second contact hole CH2 is formed using a photolithography process.

The second electrode EL2 is formed by forming a conductive layer on the third insulating layer INS3 using a conductive material and patterning the conductive layer using a photolithography process. The second electrode EL2 is connected to the common voltage line CVL through the second contact hole CH2.

Although not shown in figures, the first substrate SUB1 is disposed to face the second substrate SUB2 and the liquid crystal layer LC is formed between the first substrate SUB1 and the second substrate SUB2.

Figure 13A:
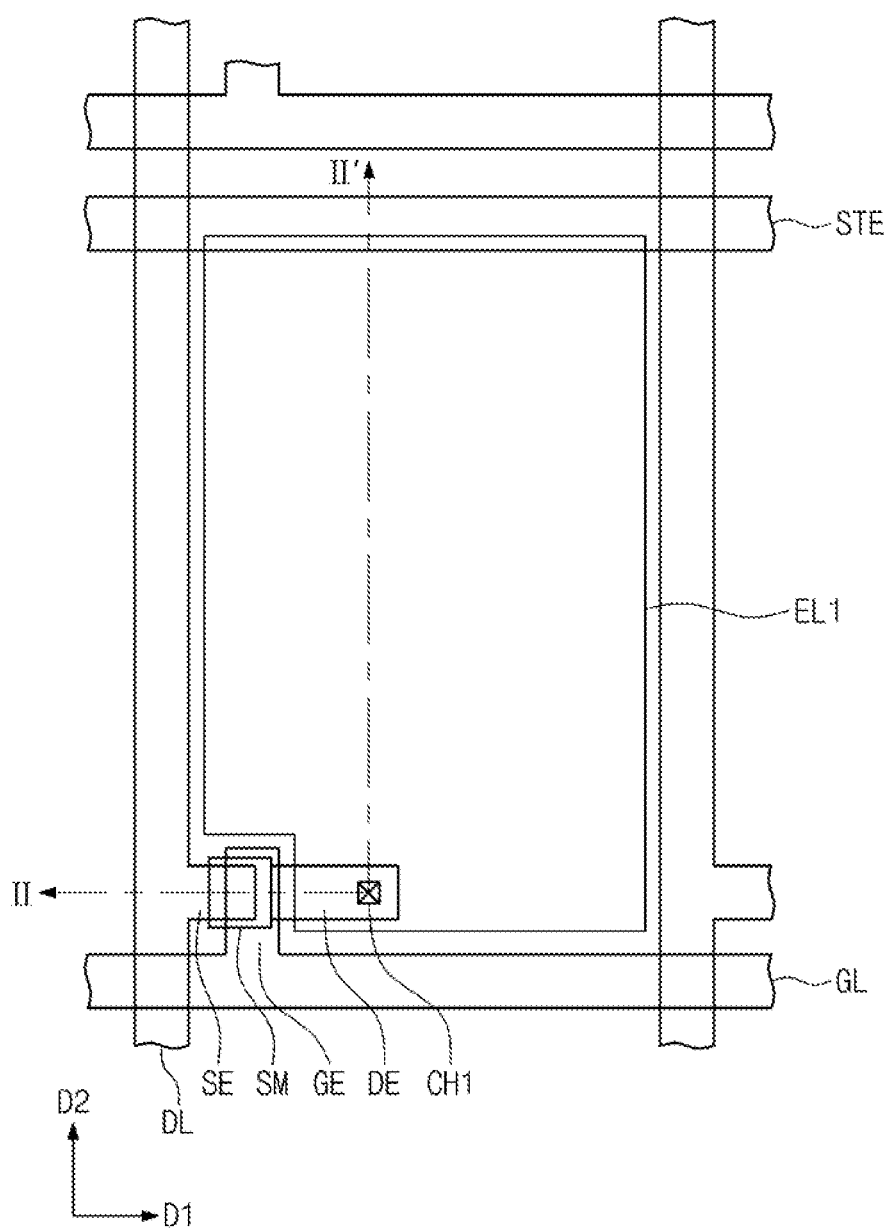
FIG. 13A is a plan view showing a display apparatus according to another exemplary embodiment of the present disclosure.
Figure 13B:
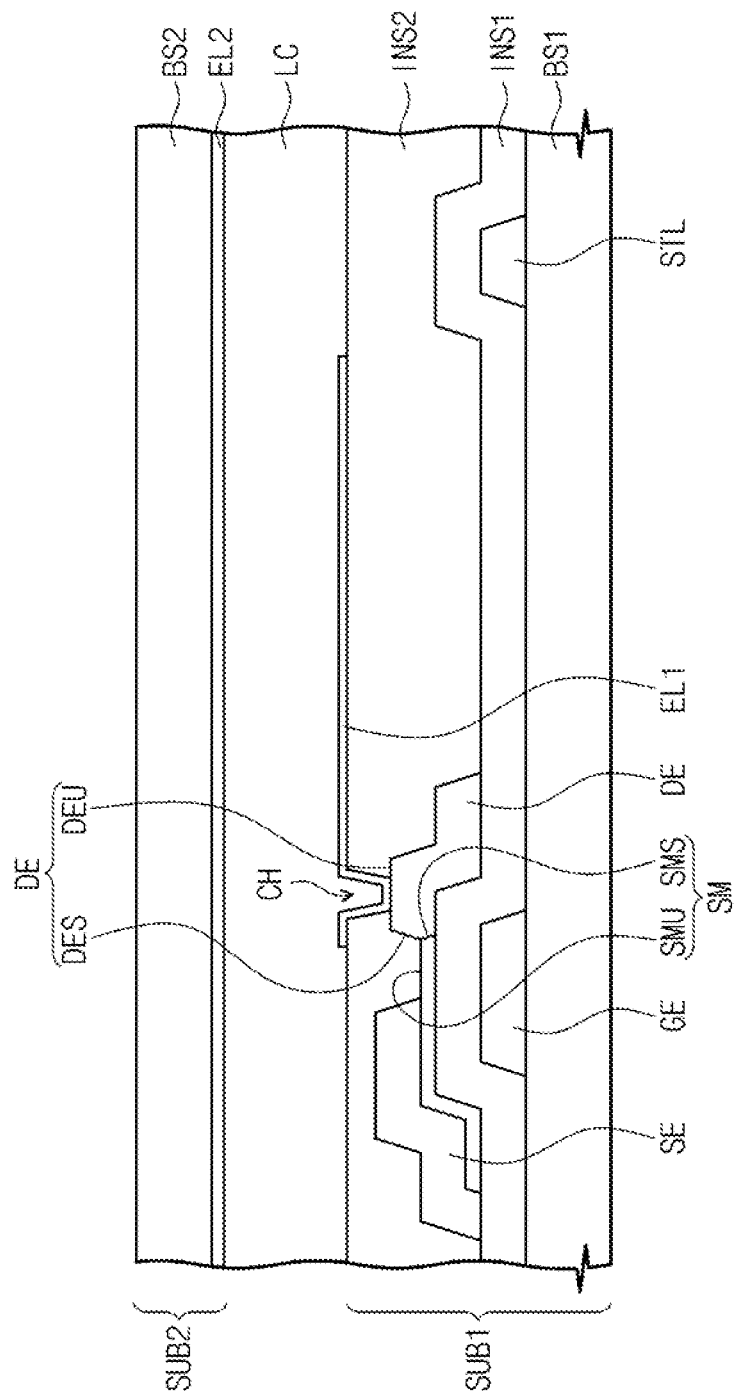
FIG. 13B is a cross-sectional view taken along a line II-II' of FIG. 13A.

FIG. 13A is a plan view showing a liquid crystal display according to another exemplary embodiment of the present disclosure and FIG. 13B is a cross-sectional view taken along a line II-II' of FIG. 13A. In FIGS. 13A and 13B, the same reference numerals denote the same elements as in FIGS. 7A and 7B, and thus detailed descriptions of the same elements will be omitted.

Referring to FIGS. 13A and 13B, a liquid crystal display includes a first substrate SUB1, a second substrate SUB2, and a liquid crystal layer LC disposed between the first substrate SUB1 and the second substrate SUB2.

The first substrate SUB1 includes a first base substrate BS1 and a first electrode EL1 disposed on the first base substrate BS1, and the second substrate SUB2 includes a second base substrate BS2 and a second electrode EL2 disposed on the second base substrate BS2.

Gate lines GL, data lines DL, and storage lines STL are disposed on the first base substrate BS1. The gate lines GL and the storage lines STL extend in a first direction D1 and the data lines DL extend in a second direction D2 crossing the first direction D1. The data lines DL are insulated from the gate lines GL and the storage lines STL by a first insulating layer INS1 interposed therebetween.

A plurality of thin film transistors are disposed on the first base substrate BS1, and each thin film transistor is connected to a corresponding gate line of the gate lines GL and a corresponding data line of the data lines DL. The thin film transistor includes a gate electrode GE, the first insulating layer INS1, a semiconductor layer SM, a source electrode SE, and a drain electrode DE.

A second insulating layer INS2 is disposed on the first insulating layer INS1 to cover the thin film transistor.

The first electrode EL1 is disposed on the second insulating layer INS2. The second insulating layer INS2 includes a first contact hole CH1 to expose a portion of the drain electrode DE, and the first electrode EL1 is connected to the drain electrode DE through the first contact hole CH1.

The first electrode EL1 overlaps a portion of the storage line STL. The first electrode ED forms a storage capacitor in cooperation with the storage line STL with the first insulating layer INS1 and the second insulating layer INS2 interposed therebetween.

The second base substrate BS2 is disposed to face the first base substrate BS1, and the second electrode EL2 is disposed on the second base substrate BS2.

The liquid crystal layer LC is disposed between the first electrode EL1 and the second electrode EL2.

A liquid crystal display having the above-mentioned structure includes a thin film transistor according to an exemplary embodiment, and thus the liquid crystal display may be stably operated. In addition, a liquid crystal display according to an exemplary embodiment may improve brightness and definition thereof. In general, since a liquid crystal display is a non self-emissive display, the liquid crystal display utilizes an external light source, such as sunlight, or requires a separate light source, such as the backlight unit. According to a conventional liquid crystal display, a light blocking part is required to prevent a channel part from being influenced by light provided from the backlight unit. However, a light blocking layer decreases light transmittance of the liquid crystal display.

However, a liquid crystal display according to a exemplary embodiment of the present disclosure includes a thin film transistor substantially unaffected by light, and thus a liquid crystal display according to a exemplary embodiment of the present disclosure need not include a light blocking layer. Thus, a liquid crystal display according to an exemplary embodiment of the present disclosure may improve brightness and definition thereof when compared with a conventional liquid crystal display.

Although the exemplary embodiments of the present disclosure have been described, it is understood that the present disclosure should not be limited to these exemplary embodiments but that various changes and modifications can be made by one of ordinary skill in the art within the spirit and scope of the present disclosure as hereinafter claimed.

For example, a liquid crystal display has been described as a representative example, but a display apparatus is not limited to a liquid crystal display. For example, a display apparatus may be an electrowetting display apparatus, an electrophoretic display apparatus, etc, and is not limited thereto.

What is claimed is:

1. A thin film transistor comprising:
a gate electrode;
a first insulating layer covering the gate electrode;
a semiconductor layer disposed on the first insulating layer wherein the semiconductor layer includes a first side surface portion;
a source electrode disposed on the semiconductor layer;
a drain electrode disposed on the first insulating layer, wherein the drain electrode includes a second side surface portion; and
a base substrate upon which the gate electrode is disposed,
wherein the first side surface portion makes contact with the second side surface portion, the drain electrode does not overlap an upper surface of the semiconductor layer in a plan view, and the upper surface of the drain electrode does not overlap any part of the entire upper surface of the semiconductor layer in a plan view,
wherein a distance between the base substrate and an upper surface of the source electrode is greater than a distance between the base substrate and an upper surface of the drain electrode, and the upper surface of the source electrode overlaps the upper surface of the semiconductor layer.

2. The thin film transistor of claim 1, wherein the upper surface of the semiconductor layer is disposed between the source electrode and the first insulating layer, but not between the drain electrode and the first insulating layer.

3. The thin film transistor of claim 1, wherein an overlap area of the gate electrode with respect to the source electrode is greater than an overlap area of the gate electrode with respect to the drain electrode.

4. The thin film transistor of claim 1, further comprising an etch stopper disposed between the source electrode and the drain electrode to cover an upper surface of the semiconductor layer.

5. The thin film transistor of claim 1, wherein the semiconductor layer comprises an oxide semiconductor that includes at least one of indium (In), gallium (Ga), zinc (Zn), and tin (Sn).

6. A display apparatus comprising:
a display device; and
a thin film transistor that applies a driving signal to the display device, wherein the thin film transistor comprises:
a gate electrode;
a first insulating layer that covers the gate electrode;
a semiconductor layer disposed on the first insulating layer that includes a side surface portion that is inclined with respect to a upper surface of the gate electrode in a cross-sectional view;
a source electrode disposed on the semiconductor layer; and
a drain electrode disposed on the first insulating layer spaced apart from the source electrode and comprises a contact surface which contacts the side surface portion of the semiconductor layer, wherein the contact surface is substantially parallel to the side surface portion and overlaps the side surface portion of the semiconductor layer in a thickness direction, wherein the contact surface has a line shape in a cross-sectional view,
wherein the upper surface of the drain electrode does not overlap any part of the upper surface of the semiconductor layer in a plan view,
wherein the drain electrode makes contact with the semiconductor layer only through the side surface portion.

7. The display apparatus of claim 6, wherein the semiconductor layer is disposed between the source electrode and the first insulating layer and the drain electrode makes direct contact with an upper surface of the first insulating layer.

8. The display apparatus of claim 6, wherein an overlap area of the gate electrode with the source electrode is greater than an overlap area of the gate electrode with the drain electrode.

9. The display apparatus of claim 6, further comprising an etch stopper disposed between the source electrode and the drain electrode to cover an upper surface of the semiconductor layer.

10. The display apparatus of claim 6, wherein the display device comprises:
a first electrode connected to the thin film transistor;
a second electrode configured to form an electric field in cooperation with the first electrode; and
a liquid crystal layer operated by the electric field.

11. The display apparatus of claim 10, further comprising a first base substrate upon which the gate electrode is disposed, a second base substrate facing the first base substrate with the liquid crystal layer interposed therebetween, wherein the first electrode is disposed on the first base substrate and the second electrode is disposed on the second base substrate.

12. The display apparatus of claim 10, further comprising a first base substrate upon which the gate electrode is disposed, a second base substrate facing the first base substrate with the liquid crystal layer interposed therebetween, wherein the first electrode and the second electrode are disposed on the first base substrate and insulated from each other.

13. The display apparatus of claim 12, wherein the first electrode is an integrally-formed single body plate, the second electrode comprises a plurality of branches, and the first electrode overlaps the branches.

14. The display apparatus of claim 13, further comprising:
a gate line that extends in a first direction to apply a gate signal to the gate electrode;
a data line that extends in a second direction crossing the first direction to apply a data signal to the source electrode; and
a common voltage line that extends in the first direction spaced apart from the gate line to apply a common voltage to the second electrode.

15. The display apparatus of claim 13, further comprising:
a second insulating layer disposed on the thin film transistor; and
a third insulating layer disposed on the second insulating layer,
wherein the first electrode is disposed on the second insulating layer and the second electrode is disposed on the third insulating layer.

16. A thin film transistor comprising:
a gate electrode that includes a first upper surface;
a first insulating layer covering the gate electrode;
a semiconductor layer disposed on the first insulating layer that overlaps at least a portion of the gate electrode, the semiconductor layer including a second upper surface substantially parallel with the first upper surface and a first side surface extended from the second upper surface that is inclined with respect to the second upper surface in a cross-sectional view;

a source electrode disposed on the semiconductor layer;
a drain electrode disposed on the first insulating layer that is spaced apart from the gate electrode; and
a base substrate upon which the gate electrode is disposed,
wherein the drain electrode makes contact with the first side surface, but not the second upper surface, of the semiconductor layer,
wherein a distance between the base substrate and an upper surface of the source electrode is greater than a distance between the base substrate and an upper surface of the drain electrode, and the upper surface of the source electrode overlaps the upper surface of the semiconductor layer, and
wherein the drain electrode does not overlap the entire second upper surface in a plan view and the drain electrode overlaps the first side surface in a plan view.

* * * * *